US011177804B2

(12) United States Patent
Cobanoglu et al.

(10) Patent No.: US 11,177,804 B2
(45) Date of Patent: Nov. 16, 2021

(54) WEARABLE TOUCH SENSITIVE GARMENT

(71) Applicant: Sanko Tekstil Isletmeleri San. Ve Tic. A.S., Inegol-Bursa (TR)

(72) Inventors: Ozgur Cobanoglu, Inegol-Bursa (TR); Adil Berk Karakaya, Inegol-Bursa (TR); Leyla Zengi, Inegol-Bursa (TR); Deniz Iyidogan, Inegol-Bursa (TR); Ertug Erkus, Inegol-Bursa (TR)

(73) Assignee: Sanko Tekstil Isletmeleri San. Ve Tic. A.S., Inegol-Bursa (TR)

( * ) Notice: Subject to any disclaimer, the term of this patent is extended or adjusted under 35 U.S.C. 154(b) by 0 days.

(21) Appl. No.: 16/716,955

(22) Filed: Dec. 17, 2019

(65) Prior Publication Data
US 2020/0204177 A1    Jun. 25, 2020

(30) Foreign Application Priority Data

Dec. 20, 2018    (EP) .................................... 18214450

(51) Int. Cl.
| | |
|---|---|
| *G06F 3/044* | (2006.01) |
| *H03K 17/96* | (2006.01) |
| *A41D 1/00* | (2018.01) |
| *G06F 3/01* | (2006.01) |

(Continued)

(52) U.S. Cl.
CPC ......... *H03K 17/9622* (2013.01); *A41D 1/005* (2013.01); *G06F 3/016* (2013.01); *G06F 3/044* (2013.01); *G06F 3/0416* (2013.01); *G06F 3/0488* (2013.01); *G06F 2203/04102* (2013.01); *H03K 2017/9602* (2013.01)

(58) Field of Classification Search
CPC ...... G06F 3/044; G06F 3/0412; G06F 3/0416; G06F 3/0446; G06F 2203/04103; G06F 2203/04112; G06F 3/041
See application file for complete search history.

(56) References Cited

U.S. PATENT DOCUMENTS 6,065,154 A * 5/2000 Hulings ............... A61N 1/3904
2/102
6,155,841 A * 12/2000 Spanyar ................ H04B 1/385
439/37

(Continued)

FOREIGN PATENT DOCUMENTS

| EP | 2895050 | 7/2015 |
| WO | 2014041032 | 9/2013 |

OTHER PUBLICATIONS

European search report and written opinion issued by the EPO for corresponding EP application No. 19218033.9 dated Feb. 21, 2020.

*Primary Examiner* — Olga V Merkoulova
(74) *Attorney, Agent, or Firm* — Silvia Salvadori

(57) ABSTRACT

It is disclosed a wearable touch sensitive garment (100) comprising an array (12) of electronic capacitive sensors integrated into the garment (100), the array (12) of electronic capacitive sensors comprising a plurality of electrodes (E1-E5), each electrode (E1-E5) being individually electrically connected to an Electronic Control Unit (ECU) (30), the ECU (30) being configured to evaluate a parasitic capacitive coupling between each of the electrodes (E1-E5) and a wearer's touch, the ECU (30) being provided with a readable display (35) configured to display an indication representative of a gesture performed on the array (12).

9 Claims, 3 Drawing Sheets

(51) Int. Cl.
*G06F 3/041* (2006.01)
*G06F 3/0488* (2013.01)

(56) References Cited

U.S. PATENT DOCUMENTS

| | | | | |
|---|---|---|---|---|
| 2005/0069695 | A1* | 3/2005 | Jung | D03D 15/02 428/328 |
| 2006/0147678 | A1* | 7/2006 | Marmaropoulos | H03K 17/952 428/172 |
| 2007/0248799 | A1* | 10/2007 | DeAngelis | G06F 3/0446 428/209 |
| 2013/0231711 | A1* | 9/2013 | Kaib | G16H 40/63 607/5 |
| 2014/0133104 | A1* | 5/2014 | Delgado | H01L 23/49894 361/715 |
| 2014/0139239 | A1* | 5/2014 | Zachut | G06F 3/044 324/658 |
| 2015/0067504 | A1* | 3/2015 | Kim | G06F 3/0485 715/708 |
| 2015/0091846 | A1* | 4/2015 | Small | G06F 3/0412 345/174 |
| 2015/0199045 | A1* | 7/2015 | Robucci | H03K 17/9622 345/174 |
| 2015/0301603 | A1* | 10/2015 | Maggiali | H03K 17/9622 345/174 |
| 2016/0048235 | A1* | 2/2016 | Poupyrev | D03D 1/0088 345/174 |
| 2017/0170749 | A1* | 6/2017 | Arizumi | H01L 41/22 |
| 2018/0239469 | A1* | 8/2018 | Connor | G06F 3/044 |
| 2018/0310644 | A1 | 11/2018 | Poupyrev et al. | |
| 2018/0321173 | A1* | 11/2018 | Hanein | A61B 5/0422 |
| 2019/0110363 | A1* | 4/2019 | Bao | H05K 3/386 |

\* cited by examiner

WEARABLE TOUCH SENSITIVE GARMENT

This application is a U.S. non-provisional application which claims priority to and the benefit of European Application No. EP18214450.1 filed on 20 Dec. 2018, the content of which is incorporated herein by reference in its entirety.

TECHNICAL FIELD

The technical field of the present invention relates to a wearable touch sensitive garment, in particular, the present invention relates to a touch sensitive garment human interface.

BACKGROUND

In the prior art, textile applications that use textile components such as yarns as sensing electrodes or place solid state electrodes in-between fabric layers are known. The use of fabric itself as a sensing electrode makes it hard to produce, as sensor yarns first need to be developed and woven: these operations are not easy as different materials with respect to common textile materials are used.

Also the materials used have to be configured and prepared, for example by multiple stripping and twisting and must be connected to the electronics with processes such as soldering and lamination. These fabric structures may have also a great number of failure paths or mechanisms compared to a robust single piece of electronics.

As an example of the above, document US20160048235 describes interactive textiles. The interactives textiles include a grid of conductive thread woven into the interactive textile to form a capacitive touch sensor that is configured to detect touch input. Detected touch inputs can be used to control remote devices.

Other prior art is represented, for example, by document US2015301603 which discloses a tactile control arrangement, including a matrix of capacitive tactile sensors, integrated in a flexible pad. The sensor matrix has a corresponding plurality of contacts for the connection with an external processing circuit module, for example, a microcontroller arranged for the acquisition and processing of the signals emitted by each sensor. Advantageously, the connection of the contacts with the processing module is implemented by means of a multipolar planar conductor strip, which is also flexible, while the processing module can be implemented by a traditional technology for hybrid circuits on rigid printed circuit support, or also on flexible supports (flex-PCB). This solution allows to place the control electronics in a remote position with respect to the sensitive part, The control electronics can possibly be separated from the sensitive area, by decoupling the connection by means of the multipolar strip, or be permanently separated and connected via radio, provided that an antenna and associated supply and driving electronics are implemented on board of the sensor matrix.

The conductors of the device are preferably made from conductive textiles.

The arrangement described in document US2015301603 can be used for the management of multiple electronic personal devices which a subject carries with him/her, tied to his/her body or kept in pockets of a jacket J, of which, a smartphone, a radar, a watch, a pair of headphones, a chest strap are illustrated from bottom to top on the left and clockwise, via the flexible control interface.

Furthermore, document US2015199045 describes a device comprising a sensor electronics array to be integrated into a garment, a bus that runs through the garment connecting with the sensor array and a computer having a display that shows the result of the gesture evaluation.

Such document discloses a proximity-based motion detection system including a capacitive sensor array (CSA) assembly and a controller, the CSA assembly including a CSA that is made up of at least two capacitor plates and conductive wires that carry signals from the capacitor plates.

The capacitor plates and other components of the device are preferably made from conductive textiles that can be integrated into other textiles, such as clothing, bed linens, etc., or that can be integrated into the environment (e.g., furniture, wheelchairs, car seats, etc.).

The conductive textile appears to make the devices of documents US2015301603 and US2015199045 bulky in addition to increase the probability of failures of the conductive textile parts.

An object of the invention is to create a wearable garment that implements a flexible touch array within the garment itself avoiding the above discussed problems of the prior art.

This and other objects are achieved by a wearable touch sensitive garment according to the independent claim.

The dependent claims delineate preferred and/or especially advantageous aspects.

SUMMARY

An embodiment of the disclosure provides a wearable touch sensitive garment comprising an array of electronic capacitive sensors integrated into the garment, the array of electronic capacitive sensors comprising a plurality of electrodes, each electrode being individually electrically connected to an Electronic Control Unit (ECU), the ECU being configured to evaluate a parasitic capacitive coupling between each of the electrodes and a wearer's touch, the ECU being provided with a readable display configured to display an indication representative of a gesture performed on the array.

The term "parasitic capacitive coupling" is herein meant to indicate the capacitive coupling between the capacitive electrode and the parasitic capacitance of a wearer's touch. In general, when an object capable of providing parasitic capacitance (e.g. a wearer's touch) approaches the capacitive electrode of the device according to the present invention, an increase of the capacitance occurs in the capacitive electrode. This fact is due to the capacitive coupling between the capacitive electrode and the parasitic capacitance of the object approaching the capacitive electrode.

Such increase of the capacitance and variations thereof can be transmitted to the ECU for further computations as explained thereinafter.

In addition to the above, the invention comprises a vibrator that provides a tactile feedback when a gesture performed on the array is detected.

The touch sensitive garment according to the invention can be used as user interface to control other devices such as phablets or for other application.

According to the invention, the electronics itself is touch-sensitive and it is placed in correspondence to the area where an user input is expected.

For example, the array of electronic capacitive sensors is arranged along a seam of said garment.

In some embodiments of the invention, the ECU can be interfaced with a Bluetooth (BT) module or a Bluetooth Low Energy (BLE) module, to connect wirelessly to a remote system such as a tablet, a smartphone or a phablet.

Another advantage of the present invention is that it avoids problems associated with the use of fabric itself as the sensing electrode which, as explained above, is not easy in practice because different materials with respect to textile materials are used. Also, in case of using textile materials, sensor yarns must be prepared by multiple stripping and twisting and connected to the electronics by soldering and lamination all of this being avoided by the present invention.

Further advantages of the present invention are that, compared to textile-based touch sensing applications, the present device is easier to mass-produce in rolls and integrate into the garment making process as a flexible "ribbon" with a stretchable bus, in order to be placed within a seam being completely invisible to the naked eye.

According to an embodiment of the invention, the device of the invention can be made in such a way that the ECU is integrated into the garment.

As an example, the device of the invention can be either made with small dimensions or even integrated within a logo patch of the garment, making the ECU completely invisible.

The device of the invention is capable of acquiring gesture events with almost 100% accuracy and precision.

Also, the on-garment evaluation of gestures makes the energy consumption of the device lower as it decreases the amount of data to be transferred to the mobile device to be controlled.

The invention further comprises a method of detecting a touch event performed on a wearable touch sensitive garment, the method comprising:
  providing a wearable touch sensitive garment;
  providing an array of electronic capacitive sensors integrated into the garment, the array of electronic capacitive sensors comprising a plurality of electrodes,
  evaluating capacitance variations provided by the plurality of electrodes;
  determining a touch event performed on the touch sensitive garment as a function of capacitance variations provided by the plurality of electrodes;
  activating a vibrator associated with the touch sensitive garment and configured to provide a tactile feedback when a gesture performed on the array is detected.

Finally the invention also comprises a computer-implemented data structure codifying a gesture performed on a wearable touch sensitive garment.

BRIEF DESCRIPTION OF THE DRAWINGS

Further aspects and advantages of the present invention will be discussed more in detail with reference to the enclosed drawings, given by way of non-limiting example, wherein.

DETAILED DESCRIPTION

Exemplary embodiments of the invention will now be described with reference to the enclosed drawings without intent to limit application and uses.

The invention will now be described with initial reference to FIG. 1 wherein a plane view of a front portion of an embodiment of the invention is shown.

Figure 1:
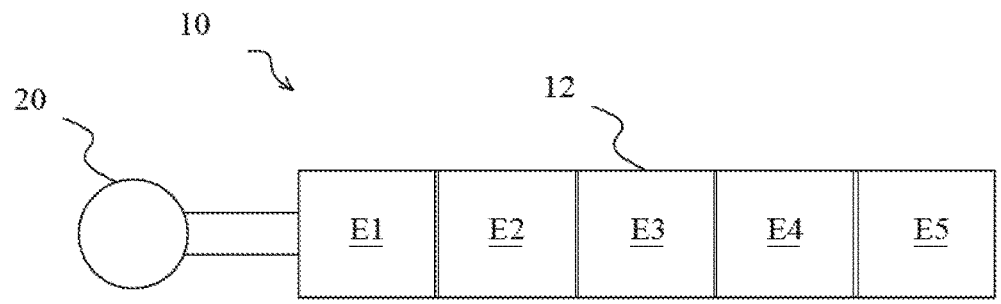
FIG. 1 shows a plane view of a front portion of an embodiment of the invention.

In particular, FIG. 1 represents an array 12 of electronic capacitive sensors that can be integrated into a garment 100, the array 12 of electronic capacitive sensors comprising a plurality of electrodes E1-E5 and an Electronic Control Unit (ECU) (30), the ECU 30 being provided with a readable display 35 configured to display an indication representative of a gesture performed on the array 12.

The electrodes E1-E5 of the array 12 are individually electrically connected to an Electronic Control Unit (ECU) 30 to form a system 10 that operates as touch sensitive garment reduced human interface (RHI).

The ECU 30 is provided with a readable display 35 configured to display an indication representative of a gesture performed on the array 12.

Furthermore, the array 12 of electronic capacitive sensors can be connected to a vibrator 20 configured to provide a tactile feedback to a user of the touch sensitive garment when a gesture performed on the array 12 is detected.

The system 10 can comprise therefore a flexible touch sensitive 1D or 2D array 12 of electrodes that can be used monitor gestures.

The array 12 can be encapsulated by a wash-fast encapsulant to resist laundry operations performed on the garment 100.

Figure 2:
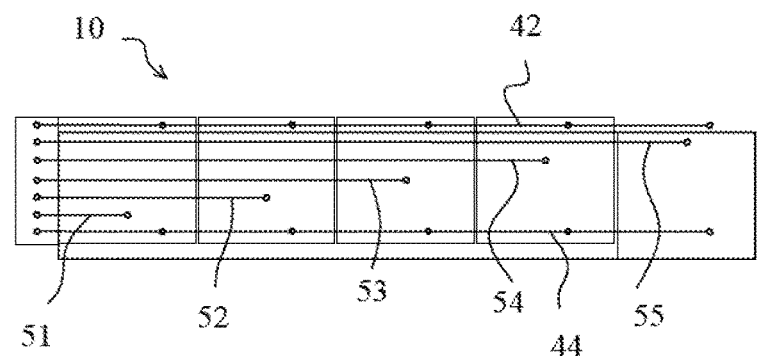
FIG. 2 shows a plane view of a back portion of an embodiment of the invention of FIG. 1.

FIG. 2 shows a plane view of a back portion of an embodiment of the invention of FIG. 1, wherein in particular, in FIG. 2 power lines 42, 44 have been schematically indicated as well as signal lines 51-55 have been schematically indicated, each signal line 51-55 connecting the respective electrode E1-E5 to the ECU 30.

Figure 4:
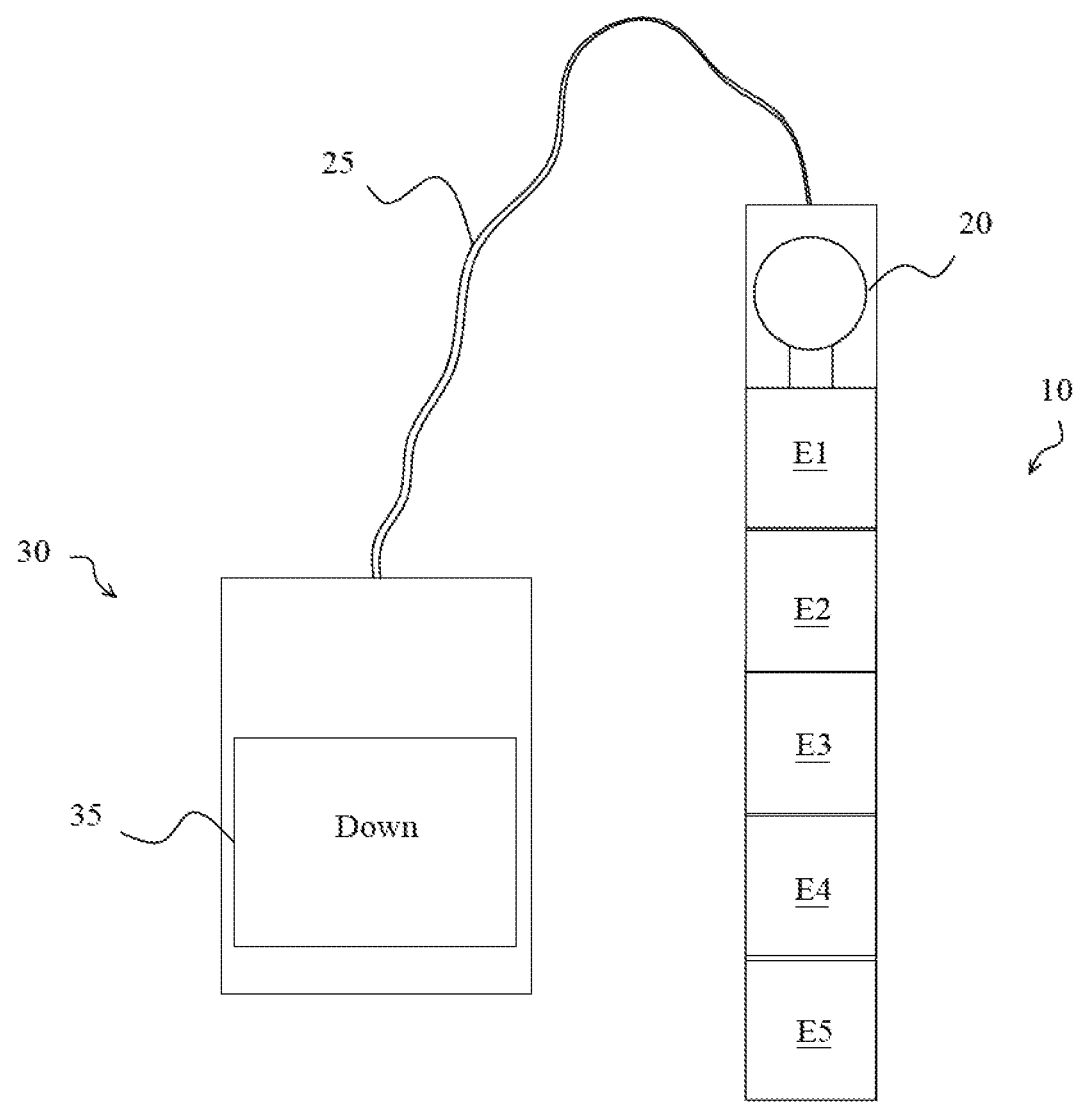
FIG. 4 shows a schematic view of an embodiment of the invention.

The array 12 of electrodes E1-E5 can be connected to the Electronic Control Unit 30 via a flexible bus 25 to carry power and data to and from the flexible touch sensitive 1D or 2D array 12. Such an embodiment is disclosed in FIG. 4.

According to an aspect of the present invention, the ECU 30 is configured to evaluate parasitic capacitive coupling by detecting an increase (or variation) of a capacitance value of the capacitive electrode.

Such parasitic capacitive coupling can be generated, for example, by means of a gesture or touch by the garment 100 wearer.

Nevertheless, it must be noted that in alternative embodiment of the invention the sensor array 12 can also be placed over the front-end electronics, an embodiment that saves space and battery power.

Figure 3:
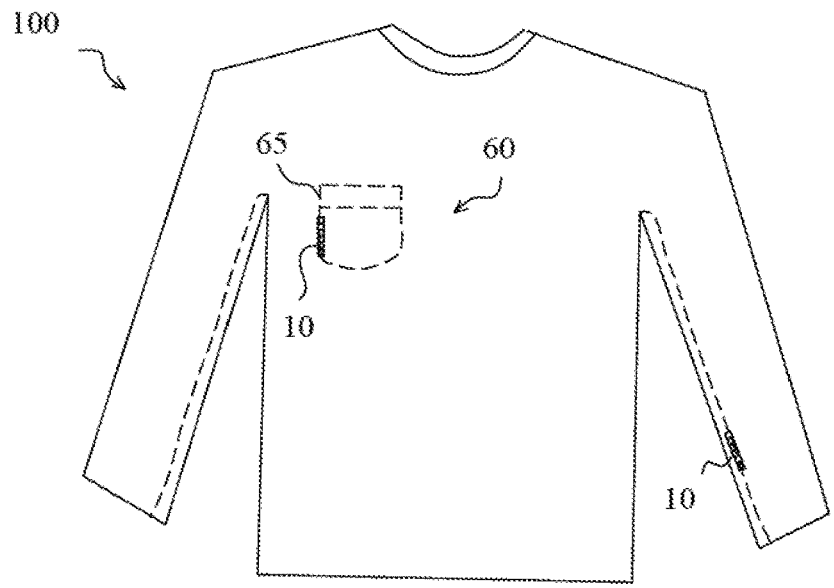
FIG. 3 shows a garment according to an embodiment of the invention.

In particular, the bus and the garment computer can all be placed under the sensors array in the final product as depicted for example in FIG. 3 which shows a garment according to this alternative embodiment of the invention.

The advantage of eliminating the bus in this embodiment can be summarized by the fact that a bus to carry the signals from the sensing elements to the electronics may lead to issues not yet completely solved because properly routing of capacitive signals requires tedious and non-sensitized paths which are expensive.

The elimination of the bus does not therefore create the issue of routing capacitive signals, but on the contrary has the effect of eliminating such issue.

The system 10 can further comprise a Bluetooth (BT) module or, alternatively, a Bluetooth Low Energy (BLE) module, to connect wirelessly the system 10 to a remote system such as a tablet, a smartphone or a phablet.

Gestures performed on the wearable touch sensitive garment 100 can therefore be used to control or operate on such remote systems.

The sensor array 12 can be made with a flexible Printed Circuit Board (PCB) such as but not limited to double sided kapton with copper layer or digitally printed flexible boards with conducting ink on PET film or rigid islands connected to each other by flexible ribbons or alike in order to form the sensor array 12.

In general, the invention provides a reduced version of a human interface (RHI) that can be integrated into a seam of a garment, for example to detect one-dimensional gesture events such as i) tap-only, ii) swipe-up, and iii) swipe-down.

With the word "seam" a side seam of a jeans or of any trousers or a seam of any garment in general or any portion of a garment that comprises at least two superimposed parts of the garment is intended in the present description.

As a non limitative example, the sensor electronics can be limited to 1.5 cm in width and garment computer to 6×3×1.5 cm$^3$.

The width of the sensor electronics advantageously allows the same extends along a seam 65 in the garment 100, for example seam 65 of pocket 60 or other seam (FIG. 3).

After populating the array 12 with electrodes E1-E5, the whole circuit is resin coated and then silicon coated.

An alternative embodiment does not have silicon coating. Silicon coated circuit has lower sensitivity with respect to the one without silicon coating.

Every time a decision is made, a tactile feedback is provided via the vibrator 20 which vibrates for a predefined amount of time, for example 50 ms, to signal a gesture acquisition or an invocation of the decision making algorithm.

A minimum of two or three sensor electrodes are needed or are enough for implementing the functionalities of the present invention, however, to obtain precision and robustness, some redundancy is considered to be needed, hence the embodiment described herein has 5 sensors, namely electrodes E1-E5.

Operation of the system is reliable and the decisions are almost 100% correct. The algorithm suppresses non-intentional taps as well.

Figure 5:
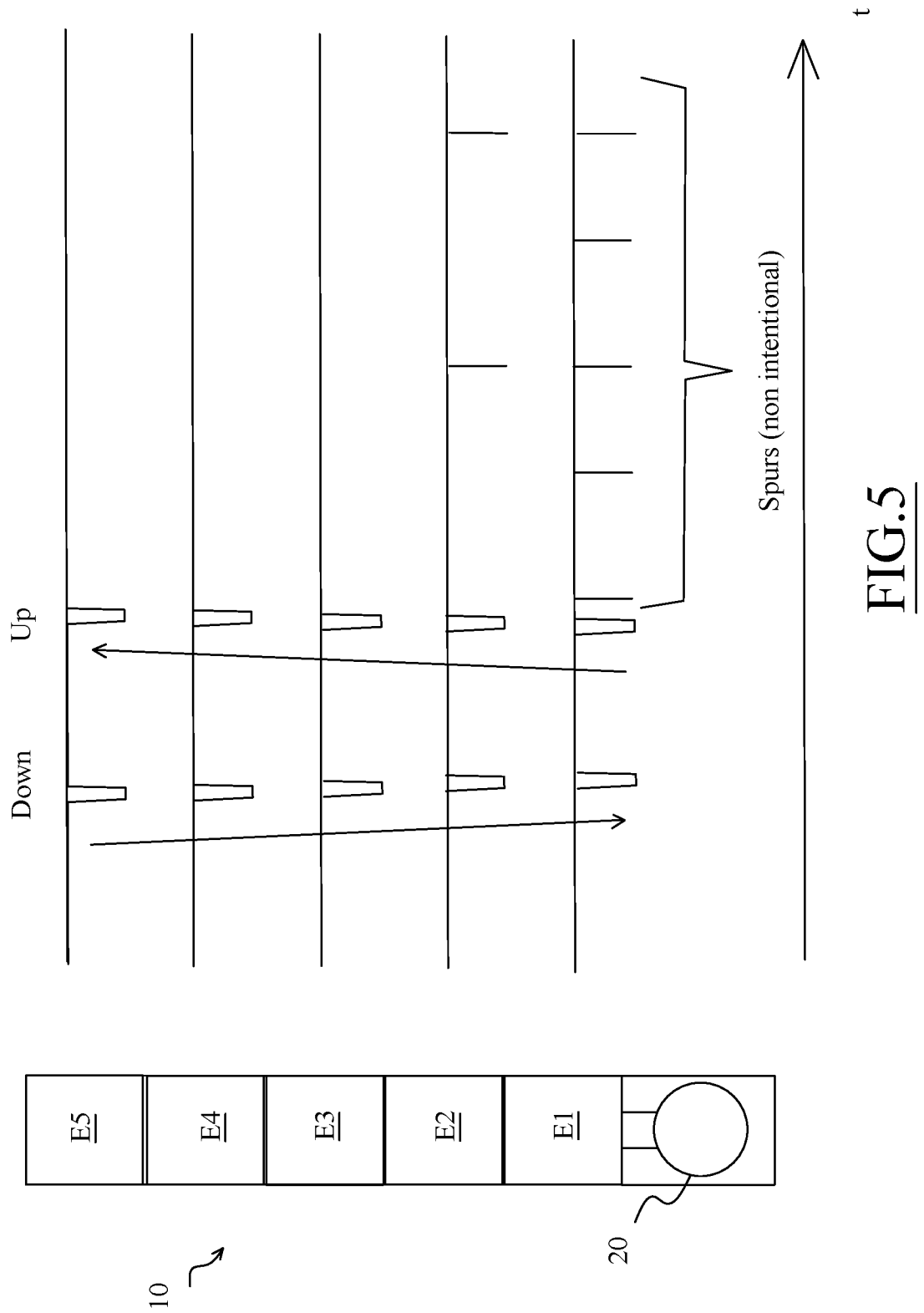
FIG. 5 shows a graph that exemplifies a possible mode of operation of the invention.

FIG. 5 shows a graph that exemplifies a possible mode of operation of the invention. In particular, in FIG. 5, raw data produced by the sensor array 12, showing intentional "down" and "up" swipe gestures as well as non-intentional touch instances are represented.

Non-intentional touch instances or noise depicted can be successfully suppressed without affecting the correctness of the decision making algorithm in identifying the intentional "down" and "up" swipe gestures.

A corresponding indication may be displayed on the display 35.

While at least one exemplary embodiment has been presented in the foregoing summary and detailed description, it should be appreciated that a vast number of variations exist. It should also be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents.

The invention claimed is:

1. A wearable touch sensitive garment (100) comprising an array (12) of electronic capacitive sensors integrated into the garment (100), the array (12) of electronic capacitive sensors comprising a plurality of electrodes (E1-E5), each electrode (E1-E5) being individually electrically connected to an Electronic Control Unit (ECU) (30), wherein the array (12) is placed over the Electronic Control Unit (ECU) (30) and is connected to said ECU (30) by means of a plurality of signal lines (51-55), each signal line connecting the respective electrode (E1-E5) to the ECU (30), to convey to the ECU (30) a parasitic capacitive coupling signal, the signal lines (51-55), being connected to the Electronic Control Unit (ECU) (30) by means of a flexible bus (25), the flexible bus (25) and the ECU (30) being placed under the sensor array (12), the ECU (30) being configured to evaluate a parasitic capacitive coupling between each of the electrodes (E1-E5) and a wearer's touch, the ECU (30) being connected to a readable display (35) configured to display an indication representative of a gesture performed on the array (12), wherein the array (12) of electronic capacitive sensors (12) is connected to a vibrator (20) configured to provide a tactile feedback to signal a gesture acquisition or an invocation of a decision making algorithm performed by the ECU (30).

2. The touch sensitive garment (100) of claim 1, wherein the array (12) is encapsulated by a wash encapsulant.

3. The touch sensitive garment (100) of claim 1, wherein the array (12) is arranged along a seam of said garment (10).

4. The touch sensitive garment (100) of claim 1, wherein the array (12) is configured as a flexible Printed Circuit Board (PCB) comprising a double sided kapton layer provided with a copper layer or as a digitally printed flexible board provided with conducting ink on PET film or as rigid islands connected to each other by flexible ribbons.

5. The touch sensitive garment (100) of claim 1, wherein the array (12) is resin coated and/or silicon coated.

6. The touch sensitive garment (100) of claim 1, wherein the ECU (30) can be interfaced with a Bluetooth (BT) module or a Bluetooth Low Energy (BLE) module, to connect wirelessly to a remote system such as a tablet, a smartphone or a phablet.

7. The touch sensitive garment (100) of claim 1, wherein the ECU is integrated into the garment (100).

8. A method of detecting a touch event performed on a wearable touch sensitive garment (100), the method comprising:
providing a wearable touch sensitive garment (100);
providing an array (12) of electronic capacitive sensors integrated into the garment (100), the array (12) of electronic capacitive sensors comprising a plurality of electrodes (E1-E5),
evaluating capacitance variations provided by the plurality of electrodes (E1-E5);
determining a touch event performed on the touch sensitive garment (100) as a function of capacitance variations provided by the plurality of electrodes (E1-E5);
activating a vibrator (20) associated with the touch sensitive garment (100) and configured to provide a tactile feedback to signal a gesture acquisition or an invocation of a decision making algorithm performed by the ECU (30).

9. A computer-implemented data structure codifying a gesture performed on a wearable touch sensitive garment (100), the wearable touch sensitive garment (100) comprising an array (12) of electronic capacitive sensors integrated into the garment (100), the array (12) of electronic capacitive sensors comprising a plurality of electrodes (E1-E5), the data structure comprising raw touch data generated by the plurality of electrodes (E1-E5), during a predefined interval of time in which a gesture event is performed on the wearable touch sensitive garment (100), the data structure being suitable to be interpreted by an electronic control unit (30) according to the method of claim 8.

* * * * *